United States Patent
Schat (10) Patent No.: US 10,866,283 B2
(45) Date of Patent: Dec. 15, 2020

(54) TEST SYSTEM WITH EMBEDDED TESTER

(71) Applicant: NXP B.V., Eindhoven (NL)

(72) Inventor: Jan-Peter Schat, Hamburg (DE)

(73) Assignee: NXP B.V., Eindhoven (NL)

(*) Notice: Subject to any disclaimer, the term of this patent is extended or adjusted under 35 U.S.C. 154(b) by 110 days.

(21) Appl. No.: 16/203,855

(22) Filed: Nov. 29, 2018

(65) Prior Publication Data

US 2020/0174070 A1 Jun. 4, 2020

(51) Int. Cl.
- *G01R 31/3185* (2006.01)
- *G01R 31/3167* (2006.01)
- *G01R 31/3187* (2006.01)

(52) U.S. Cl.
CPC . *G01R 31/318536* (2013.01); *G01R 31/3167* (2013.01); *G01R 31/3187* (2013.01); *G01R 31/31855* (2013.01); *G01R 31/318552* (2013.01); *G01R 31/318555* (2013.01)

(58) Field of Classification Search
CPC ........ G01R 31/318536; G01R 31/3167; G01R 31/3187
See application file for complete search history.

(56) References Cited

U.S. PATENT DOCUMENTS

| | | | | |
|---|---|---|---|---|
| 5,428,624 A * | 6/1995 | Blair | ............... | G01R 31/318547 324/762.02 |
| 5,477,545 A * | 12/1995 | Huang | ........... | G01R 31/318541 324/762.02 |
| 5,600,788 A * | 2/1997 | Lofgren | ......... | G01R 31/318536 714/31 |
| 5,968,191 A * | 10/1999 | Thatcher | .......... | G01R 31/31723 714/723 |
| 5,991,909 A * | 11/1999 | Rajski | .............. | G01R 31/31813 714/729 |
| 6,000,051 A * | 12/1999 | Nadeau-Dostie | ........................... | G01R 31/31855 327/144 |
| 6,011,387 A * | 1/2000 | Lee | ................ | G01R 31/318536 324/73.1 |
| 6,311,300 B1 * | 10/2001 | Omura | ............. | G01R 31/31724 714/724 |
| 6,381,717 B1 * | 4/2002 | Bhattacharya | .............................. | G01R 31/318533 712/227 |
| 6,587,979 B1 * | 7/2003 | Kraus | .................... | G11C 29/46 714/702 |

(Continued)

OTHER PUBLICATIONS

Chakraborty, T., "A Practical Approach to Comprehensive System Test & Debug Using Boundary Scan Based Test Architecture", International Test Conference, Lecture 3.2, IEEE 2007.

(Continued)

*Primary Examiner* — Joseph D Torres (57) ABSTRACT

A test system is provided. The test system includes a printed circuit board (PCB) and a plurality of integrated circuits (ICs) mounted on the PCB. A first IC of the plurality includes a first test circuit having a first test access port (TAP) controller. A second IC of the plurality includes a second test circuit having a second TAP controller and an embedded tester having a test data output coupled to a test data input of the first TAP controller by way of a link circuit. The embedded tester is configured to provide test control signals to the first TAP controller and the second TAP controller.

20 Claims, 3 Drawing Sheets

(56) References Cited

U.S. PATENT DOCUMENTS

| | | | |
|---|---|---|---|
| 6,686,759 B1* | 2/2004 | Swamy | G01R 31/318558 324/750.15 |
| 6,836,866 B2* | 12/2004 | Nolles | G01R 31/3187 714/728 |
| 6,901,543 B2* | 5/2005 | Dorsey | G01R 31/318522 324/750.3 |
| 6,981,191 B2* | 12/2005 | Dorsey | G01R 31/3187 714/733 |
| 6,996,760 B2* | 2/2006 | Dorsey | G01R 31/318516 714/718 |
| 7,096,398 B1* | 8/2006 | Mukherjee | G01R 31/31705 714/733 |
| 7,409,612 B2 | 8/2008 | Van De Logt et al. | |
| 7,958,479 B2 | 6/2011 | Chakraborty et al. | |
| 2002/0040458 A1* | 4/2002 | Dervisoglu | G01R 31/318505 714/729 |
| 2002/0095633 A1* | 7/2002 | Pillkahn | G01R 31/318555 714/734 |
| 2004/0059959 A1* | 3/2004 | Ozawa | G01R 31/31724 714/30 |
| 2008/0052582 A1 | 2/2008 | Jun et al. | |
| 2011/0113298 A1* | 5/2011 | Van Den Eijnden | G01R 31/31855 714/727 |
| 2011/0148456 A1 | 6/2011 | Mooyman-Beck et al. | |
| 2011/0179325 A1 | 7/2011 | Gupta et al. | |
| 2012/0290890 A1* | 11/2012 | Van Den Eijnden | G01R 31/318538 714/727 |
| 2013/0328583 A1* | 12/2013 | Wada | G01R 31/2884 324/750.3 |
| 2015/0123696 A1 | 5/2015 | Bhogela et al. | |
| 2018/0172761 A1 | 6/2018 | Van Beers et al. | |

OTHER PUBLICATIONS

Haberl, O., "Self Testable Boards with Standard IEEE 1149.5 Module Test and Maintenance (MTM) Bus Interface", IEEE 1994.

Hunt, C., "Lead-free Solders and PCB Finish Effects on Solder Joint Reliability", 2006 Electronics Systemintegration Technology Conference, IEEE 2006.

IEEE Standards Association, "IEEE Standard for Test Access Port and Boundary-Scan Architecture", IEEE 1149.1, pp. 13-23, May 13, 2013.

IEEE Standards Association, "IEEE Standard for a Mixed-Signal Test Bus", IEEE 1149,4, pp. 11-16, Mar. 18, 2011.

IEEE Standards Association, "IEEE Standard for Boundary-Scan Testing of Advanced Digital Networks", IEEE 1149.6, pp. 11-41, 2015.

IEEE Standards Association, "IEEE Standard for Reduced-Pin and Enhanced-Functionality Test Access Port and Boundary-Scan Architecture", IEEE 1149.7, pp. 36-67, Feb. 10, 2010.

IEEE Standard Association, "IEEE Standard for Access and Control of Instrumentation Embedded within a Semiconductor Device", IEEE 1687, pp. 19-56, 2014.

Lee, N., "PCB Engineering for Improving Temperature Cycling Reliability of Lead-free Solder Ball Joint", IEEE 24th International Symposium on the Physical and Failure Analysis of Integrated Circuits(IPFA), pp. 1-6, 2017.

Portolan, M., "Accessing 1687 Systems Using Arbitrary Protocols", International Test Conference, IEEE 2016.

Tian, X., "Reliability, Thermal Anaiysis and Optimization Wirability Design of Multi-Layer PCB Boards", 2002 Proceedings Annual Reliability and Maintainability Symposium, EEEE 2002.

\* cited by examiner

TEST SYSTEM WITH EMBEDDED TESTER

BACKGROUND

Field

This disclosure relates generally to test systems, and more specifically, to a test system with an embedded tester.

Related Art

Today's electronic systems are reaching new levels of sophistication and complexity. Such systems may include multiple integrated circuits interconnected on a printed circuit board, for example. Each integrated circuit generally requires rigorous testing before being assembled onto the printed circuit board. Once assembled as a system, interconnections between the integrated circuits and the printed circuit board are confirmed by way of factory testing. However, any latent defects can remain undetected.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a board level test system for in-application boundary scan testing. The system includes a plurality of integrated circuits (ICs) mounted on a printed circuit board (PCB) and configured in a daisy chain arrangement. One IC of the plurality includes an embedded tester which sends test commands to other ICs of the chain by driving test control signals when an external tester is not connected to the system. The embedded tester provides a test data stream to a next IC in the chain by way of a link circuit. When an external tester is connected to the system, outputs of the embedded tester are configured in a high impedance state so that the external tester can drive the test control signals unimpeded.

Figure 1:
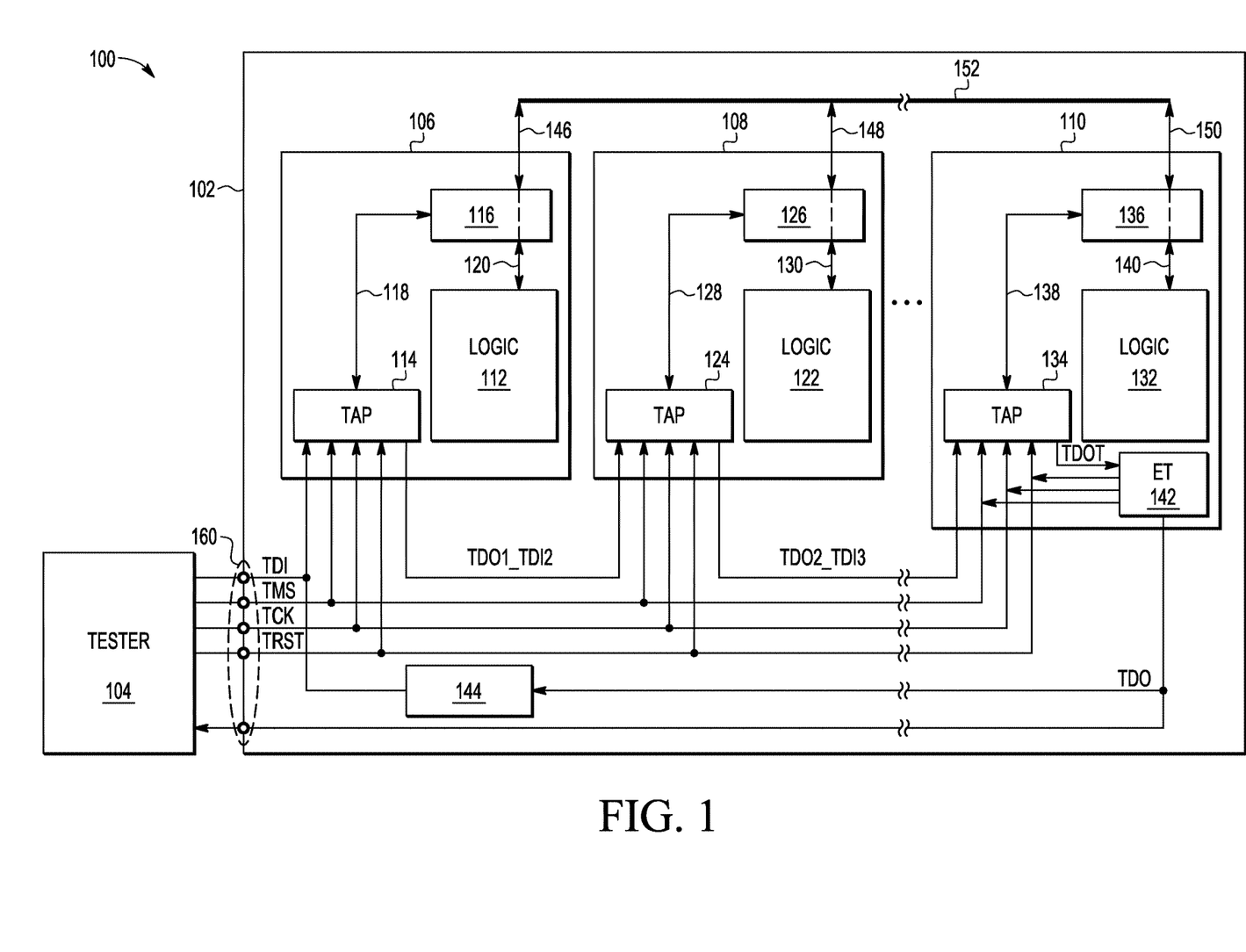
FIG. 1 illustrates, in block diagram form, an example board level test system in accordance with an embodiment.

FIG. 1 illustrates, in block diagram form, an example board level test system 100 in accordance with an embodiment. System 100 includes a printed circuit board (PCB) 102, a plurality of integrated circuits (ICs) 106-110 mounted on the PCB 102, a plurality of test signal lines (e.g., TDI, TMS, TCK, TRST, TDO) and a bus 152 interconnecting ICs 106-110, and a link circuit 144. PCB 102 may be formed as a multi-layer PCB having a plurality of conductive layers (e.g., metal) separated by dielectric material (e.g., FR-4). Bus 152 can be any type of bus for communicating and transferring any type of information such as data, address, instructions, control signals (e.g., reset, mode, and clock signals), analog signals, and the like. Bus 152 is formed at least in part as one or more conductive paths or traces on the PCB 102. ICs 106-110 are bi-directionally connected to bus 152 by way of respective connection lines 146-150.

An external tester 104 may be connected at a tester connection port 160 of PCB 102 in a factory test environment to provide test signals during factory testing. External tester 104 includes outputs for providing test data in (TDI), test mode select (TMS), test clock (TCK), and test reset (TRST) signals. External tester 104 also includes an input for receiving a test data out (TDO) signal. While in a factory test mode, external tester 104 may provide a serial data stream by way of the TDI output signal to the first IC 106 of a scan chain formed by the daisy-chained interconnected ICs 106-110. In turn, external tester 104 receives a resulting data stream from the last IC of the scan chain by way of the TDO signal and compares received data with expected data. When a mismatch occurs, an error may be detected.

System 100 may include a plurality of ICs mounted on PCB 102. In this embodiment, system 100 includes ICs 106-110 configured in a daisy chain arrangement which accommodates boundary scan testing by way of serially connected input and output test data signal lines (e.g., TDI and TDO). ICs 106 and 108 may be any type of IC which includes a logic circuit block 112, 122, a test access port (TAP) controller 114, 124, and a boundary scan circuit block 116, 126. IC 110 may be any type of IC which includes a logic circuit block 132, a TAP controller 134, a boundary scan circuit block 136, and an embedded tester (ET) 142.

Logic circuit blocks 112, 122, 132 may include any number or type of logic circuits such as a microprocessor, microcontroller, digital signal processor, timer, serial communication, state machine, volatile and/or non-volatile memory (e.g., static random-access memory (SRAM), dynamic random-access memory (DRAM), flash, etc.) controller, or any combinations thereof. For example, IC 106 may be characterized as a microprocessor device with logic circuit 112 including a microprocessor, IC 108 may be characterized as memory device with logic circuit 122 including memory control logic, and IC 110 may be characterized as a system-on-chip (SoC) device with logic circuit 132 including a controller, memory, and peripherals.

Test signal lines couple test control signals to and from each IC of the chain including ICs 106-110. The TMS, TCK, and TRST signal lines include a first connection at corresponding inputs of TAP controllers 114, 124, and 134, and a second connection at port 160. The TDI signal line includes a first connection at a corresponding input of TAP controller 114 of the first IC 106 of the chain, a second connection at an output of link circuit 144, and a third connection at port 160. The TDO1_TDI2 signal line includes a first connection at a test data out (TDO1) output of TAP controller 114 of the first IC 106 of the chain and a second connection at a corresponding test data in (TDI2) input of TAP controller 124 of the second IC 108 of the chain. The TDO2_TDI3 signal line includes a first connection at a test data out (TDO2) output of TAP controller 124 of the second IC 108 of the chain and a second connection at a corresponding test data in (TDI3) input of TAP controller 134 of the third IC 110 of the chain. The TDO signal line includes a first connection at an output of the third IC 110 of the chain, a second connection at an input of link circuit 144, and a third connection at port 160.

Link circuit 144 is coupled in the path from the TDO output of IC 110 to the TDI input of IC 106. Link circuit 144 is configured to allow transfer of the test data output signal TDO from the output of IC 110 to the TDI input of TAP controller 114 of IC 106 when the external tester 104 is not connected to the PCB 102. In this embodiment, link circuit 144 includes a resistor having a first terminal coupled at the TDO signal line and a second terminal coupled at the TDI signal line. The resistor may be in a range of 1 k ohms to 10*k* ohms. In other embodiments, link circuit 144 may include other circuit elements (e.g., a diode or a MOSFET) configured to allow transfer the TDO signal to the TDI input when the external tester 104 is not connected to the PCB 102.

ET 142 is embedded within IC 110 and configured to provide test commands by way of test control signals when the PCB 102 is not connected to the external tester 104. For example, when system 100 is in the field (e.g., in application) and PCB 102 not connected to the external tester 104, the ET 142 serves as the "in the field" tester and is configured to perform JTAG (IEEE 1149.1 compliant) boundary scan testing of ICs 106-110 and the connections between ICs 106-110 and the bus 152, for example. In this embodiment, the ET 142 includes an input to receive a test data out signal TDOT from TAP controller 134 and outputs to drive the TMS, TCK, TRST, and TDO signal lines when the external tester 104 is not connected to PCB 102. A test data out signal TDO is provided to the test data in TDI input of the first IC 106 of the chain by way of link circuit 144 and coupled TDO and TDI labeled signal lines.

When the external tester 104 is connected to PCB 102 and performing a boundary scan test, for example, the test data out signal TDO from IC 110 is provided to the external tester 104. The test data out signal TDOT from the TAP controller 134 is routed to the ET 142 by way of signal line labeled TDOT, then routed to the TDO signal line in a feedthrough or bypass manner. ET 142 outputs for driving TMS, TCK, TRST signals are in a high impedance state allowing the external tester 104 to drive the corresponding signal lines unimpeded.

TAP controllers 114, 124, and 134 are coupled to boundary scan circuits 116, 126, and 136 by way of respective command signal lines 118, 128, and 138. Logic circuits 112, 122, and 132 are coupled to respective connection lines 146-150 by way of respective internal connection lines 120, 130, and 140 and boundary scan circuits 116, 126, and 136. In a normal application mode of system 100, boundary scan circuits 116, 126, and 136 are transparent to the normal function and communication of signals between respective logic circuits 112, 122, and 132 and bus 152. In a boundary scan test mode, for example, TAP controllers 114, 124, and 134 are configured to receive respective test data in (e.g., TDI, TDO1_TDI2, TDO2_TDI3), test mode select (e.g., TMS), test clock (e.g., TCK), and test reset (e.g., TRST) signals. In the test mode, the TAP controllers 114, 124, and 134 are configured to provide command signals to respective boundary scan circuits 116, 126, and 136 to control digital signals transferred between respective logic circuits 112, 122, and 132 and bus 152.

Basic functionality of an in the field boundary scan test is described by way of the following example. ET 142 provides test control signals to configure the boundary scan circuit 116 to control output signals 146 of IC 106 and to configure boundary scan circuits 126 and 136 to receive these output signals. The TDO output of ET 142 provides a stream of test data by way of link circuit 144 to the TDI input of TAP controller 114. In turn, a resulting test data stream TDO1_TDI2 is shifted from the test data output of TAP controller 114 and received by the test data input of TAP controller 124. In turn, a resulting data stream TDO2_TDI3 is shifted from the test data output of TAP controller 124 and received at the test data input of TAP controller 134. In turn, a resulting data stream TDOT is shifted from the test data output of TAP controller 134 and received at the corresponding input of ET 142. When the ET 142 detects a mismatch between the received data stream TDOT and expected data, an error indication is generated. The boundary scan test may be performed at power-up and/or reset of system 100. The boundary scan test may also be performed concurrently with the normal application operation of system 100 by sampling logic values of I/O signals that go through the boundary scan circuits 116, 126, and 136 and outputting the sampled values by way of the TDOx_TDIy chain (where x refers to an IC in the chain and y refers to the next IC in the chain).

Figure 2:
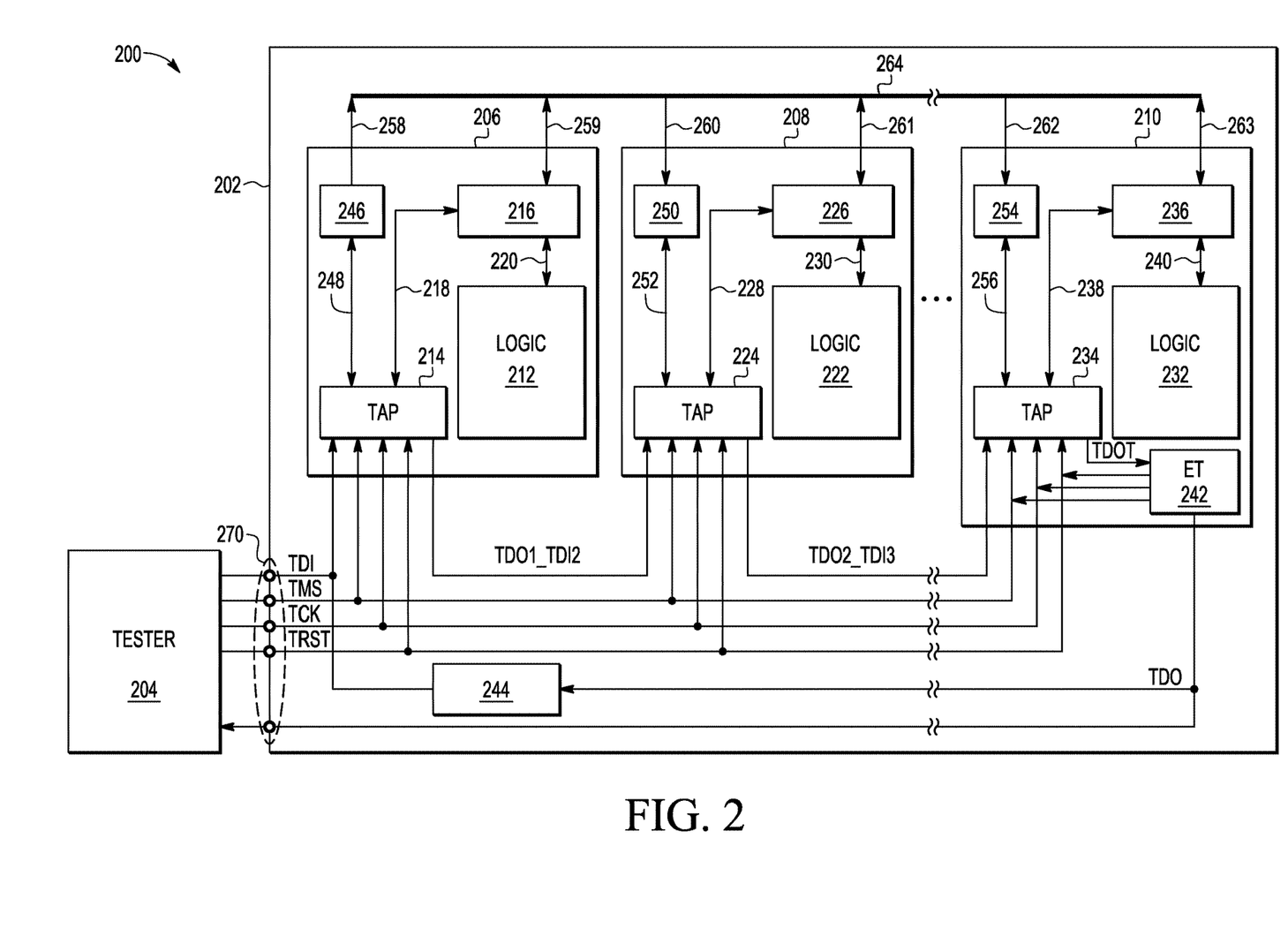
FIG. 2 illustrates, in block diagram form, another example board level test system in accordance with an embodiment.

FIG. 2 illustrates, in block diagram form, another example board level test system 200 in accordance with an embodiment. System 200 includes a PCB 202, a plurality of ICs 206-210 mounted on the PCB 202, a plurality of test signal lines (e.g., TDI, TMS, TCK, TRST, TDO) and a bus 264 interconnecting ICs 206-210, and a link circuit 244. PCB 202 may be formed as a multi-layer PCB having a plurality of conductive layers (e.g., metal) separated by dielectric material (e.g., FR-4). Bus 264 can be any type of bus for communicating and transferring any type of information such as data, address, instructions, control signals (e.g., reset, mode, and clock signals), analog signals, and the like. In this embodiment, bus 264 may be characterized at least in part as an analog test bus (ATB). Bus 264 is formed at least in part as one or more conductive paths or traces on the PCB 202. ICs 206-210 are connected to bus 264 by way of respective connection lines 258-263.

An external tester 204 may be connected at a tester connection port 270 of PCB 202 in a factory test environment to provide test signals during factory testing. External tester 204 includes outputs for providing test data in (TDI), test mode select (TMS), test clock (TCK), and test reset (TRST) signals. External tester 204 also includes an input for receiving a test data out (TDO) signal. While in a factory test mode, external tester 204 may provide a serial data stream by way of the TDI output signal to the first IC 206 of a scan chain formed by the daisy-chained interconnected ICs 206-210. In turn, external tester 204 receives a resulting data stream from the last IC of the scan chain by way of the TDO signal and compares received data with expected data. When a mismatch occurs, an error may be detected.

System 200 may include any number of ICs mounted on PCB 202. In this embodiment, system 200 includes ICs 206-210 configured in a daisy chain arrangement which accommodates boundary scan testing by way of serially connected input and output test data signal lines (e.g., TDI and TDO). ICs 206 and 208 may be any type of IC which includes a logic circuit block 212, 222, a test access port (TAP) controller 214, 224, a boundary scan circuit block 216, 226, and an analog circuit block 246, 250. IC 210 may be any type of IC which includes a logic circuit block 232, a TAP controller 234, a boundary scan circuit block 236, an analog circuit block 254, and an embedded tester (ET) 242.

Logic circuit blocks 212, 222, 232 may include any number or type of logic circuits such as a microprocessor, microcontroller, digital signal processor, timer, serial communication, control logic, state machine, volatile and/or non-volatile memory controller, or any combinations thereof. Analog circuit blocks 246, 250, and 254 include analog I/O pins coupled to bus 264 by way of connection lines 258, 260, and 262. Analog circuit blocks 246, 250, and 254 include analog boundary test circuits and may include any number or type of analog circuits such as analog-to-digital converter, digital-to-analog converter, PLL, bias circuit, voltage and/or current reference circuit, current mirror, amplifier, filter, and so on. For example, IC 206 may be characterized as a processor device with analog circuit block 246 including a voltage reference circuit, IC 208 may be characterized as memory device with analog circuit block 250 including a bias circuit, and IC 210 may be characterized as a system-on-chip (SoC) device with analog circuit block 254 including an analog-to-digital converter.

Test signal lines couple test control signals to and from each IC of the chain including ICs 206-210. The TMS, TCK, and TRST signal lines include a first connection at corresponding inputs of TAP controllers 214, 224, and 234, and a second connection at port 270. The TDI signal line includes a first connection at a corresponding input of TAP controller 214 of the first IC 206 of the chain, a second connection at an output of link circuit 244, and a third connection at port 270. The TDO1_TDI2 signal line includes a first connection at a test data out (TDO1) output of TAP controller 214 of the first IC 206 of the chain and a second connection at a corresponding test data in (TDI2) input of TAP controller 224 of the second IC 208 of the chain. The TDO2_TDI3 signal line includes a first connection at a test data out (TDO2) output of TAP controller 224 of the second IC 208 of the chain and a second connection at a corresponding test data in (TDI3) input of TAP controller 234 of the third IC 210 of the chain. The TDO signal line includes a first connection at an output of the third IC 210 of the chain, a second connection at an input of link circuit 244, and a third connection at port 270.

Link circuit 244 is coupled in the path from the TDO output of IC 210 to the TDI input of IC 206. Link circuit 244 is configured to allow transfer of the test data output signal TDO from the output of IC 210 to the TDI input of TAP controller 214 of IC 206 when the external tester 204 is not connected to the PCB 202. In this embodiment, link circuit 244 includes a resistor having a first terminal coupled at the TDO signal line and a second terminal coupled at the TDI signal line. The resistor may be in a range of 1 k ohms to 10$k$ ohms, for example. In other embodiments, link circuit 244 may include other circuit elements (e.g., a diode or a MOSFET) configured to allow transfer the TDO signal to the TDI input when the external tester 204 is not connected to the PCB 202.

ET 242 is embedded within IC 210 and configured to provide test commands by way of test control signals when the PCB 202 is not connected to the external tester 204. For example, when system 200 is in the field (e.g., in application) and PCB 202 is not connected to the external tester 204, the ET 242 serves as the "in the field" tester and is configured to perform JTAG IEEE 1149.1 compliant boundary scan testing as well as IEEE 1149.4 compliant analog boundary testing of ICs 206-210. In this embodiment, the ET 242 includes an input to receive a test data out signal TDOT from TAP controller 234 and outputs to drive the TMS, TCK, TRST, and TDO signal lines when the external tester 204 is not connected to PCB 202. A test data out signal TDO is provided to the test data in TDI input of the first IC 206 of the chain by way of link circuit 244 and coupled TDO and TDI labeled signal lines.

When the external tester 204 is connected to PCB 202 and performing a boundary scan test, for example, the test data out signal TDO from IC 210 is provided to the external tester 204. The test data out signal TDOT from the TAP controller 234 is routed to the ET 242 by way of signal line labeled TDOT, then routed to the TDO signal line in a feedthrough or bypass manner. ET 242 outputs for driving TMS, TCK, TRST signals are in a high impedance state allowing the external tester 204 to drive the corresponding signal lines unimpeded.

TAP controllers 214, 224, and 234 are coupled to boundary scan circuits 216, 226, and 236 by way of respective command signal lines 218, 228, and 238 and analog circuit blocks 246, 250, and 254 by way of respective command signal lines 248, 252, and 256. Logic circuits 212, 222, and 232 are coupled to connection lines 259, 261, and 263 by way of respective internal connection lines 220, 230, and 240 and boundary scan circuits 216, 226, and 236. In a normal application mode of system 200, analog boundary test circuits of analog circuit blocks 246, 250, and 254 are transparent to the normal function and communication of analog signals between respective analog circuits of analog circuit blocks 246, 250, and 254 and bus 264. In an analog boundary test mode, for example, TAP controllers 214, 224, and 234 are configured to receive respective test data in (e.g., TDI, TDO1_TDI2, TDO2_TDI3), test mode select (e.g., TMS), test clock (e.g., TCK), and test reset (e.g., TRST) signals. In the test mode, the TAP controllers 214, 224, and 234 are configured to provide command signals to respective analog boundary test circuits of analog circuit blocks 246, 250, and 254 to control analog signals transferred between respective analog circuit blocks 246, 250, and 254 and bus 264. For example, a voltage or current value may be transferred from analog circuit block 246 and routed to analog circuit block 254 by way of bus 264 and respective connection lines 258 and 262.

Basic functionality of an in the field analog boundary test is described by way of the following example. ET 242 provides test control signals to configure the analog boundary test circuits of analog circuit block 246 to control output signal 258 of IC 206 and to configure analog boundary test circuits of analog circuit blocks 250 and 254 to receive the output signal 258 by way of respective input signal lines 260 and 262. The TDO output of ET 242 provides a stream of test data by way of link circuit 244 to the TDI input of TAP controller 214. In turn, a resulting test data stream TDO1_TDI2 is shifted from the test data output of TAP controller 214 and received by the test data input of TAP controller 224. In turn, a resulting data stream TDO2_TDI3 is shifted from the test data output of TAP controller 224 and received at the test data input of TAP controller 234. In turn, a resulting data stream TDOT is shifted from the test data output of TAP controller 234 and received at the corresponding input of ET 242. When the ET 242 detects a mismatch between the received data stream TDOT and expected data, an error indication is generated. The boundary test may be performed at power-up and/or reset of system 200. The boundary test may also be performed concurrently with the normal application operation of system 200 by sampling analog values of I/O signals that go through the analog boundary test circuits of analog circuit blocks 246, 250, and 254.

Figure 3:
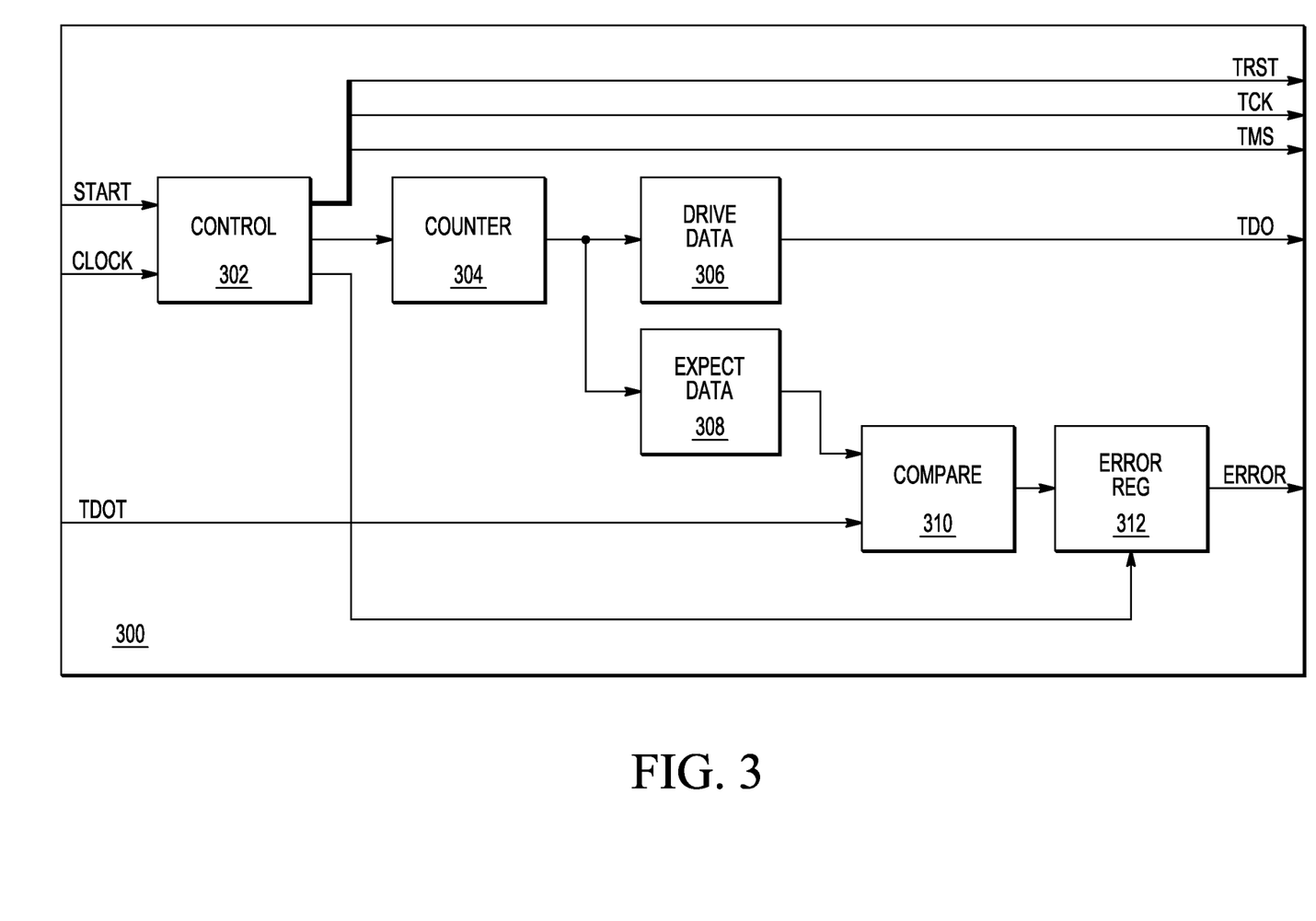
FIG. 3 illustrates, in block diagram form, an example embedded tester in accordance with an embodiment.

FIG. 3 illustrates, in block diagram form, an example embedded tester (ET) 300 in accordance with an embodiment. ET 300 is a representative embedded tester for ET 144 in system 100 and ET 244 in system 200 as depicted in FIG. 1 and FIG. 2 respectively. ET 300 includes control circuit 302, counter circuit 304, drive data circuit 306, expect data circuit 308, compare circuit 310, and error register circuit 312.

Control circuit 302 includes inputs to receive a start signal labeled START and a clock signal labeled CLOCK. The START and CLOCK signals may be provided by a host IC (e.g., IC 110, IC 210) in which ET 300 is embedded. Control circuit 302 includes control circuitry (e.g., state machine, processor, etc.) configured to provide test reset signal TRST, test clock signal TCK, and test mode select signal TMS at outputs labeled TRST, TCK, and TMS respectively. Control circuit 302 also provides control signals to counter 304 and error register 312.

Counter 304 includes an input coupled to receive the control signal from control circuit 302. Counter 304 serves as a time base for shifting data. Counter 304 provides an output signal for the drive data circuit 306 and the expect data circuit 308. Drive data circuit 306 includes a memory and/or circuitry for generating a test data stream. The test data stream includes a pattern of data bits shifted out based on an output signal of counter 304. The shifted test data stream is provided as test data out signal TDO at the output labeled TDO and is received at a test data in TDI input (e.g., TAP controller 114, 214). Expect data circuit 308 includes a memory programmed with a predetermined pattern of expected data bit values. The expect data bits are shifted out based on an output signal of counter 304.

Compare circuit 310 includes a first input coupled to receive the shifted expect data stream and a second input coupled to receive the test data out stream from the last IC of the chain (e.g., TDOT from TAP controller 134, 234). Compare circuit 310 includes circuitry for comparing the incoming test data out stream with the expect test data stream. When the compare circuit 310 detects a mismatch, an error may be indicated by way of an output signal at an output of the compare circuit 310.

Error register 312 includes a first input coupled to receive the output signal of the compare circuit 310 and a second input coupled to receive a control signal from the control circuit 302. The error register 312 includes circuitry configured to store the error indication received from the compare circuit 310 and to provide an error flag output signal at an output labeled ERROR.

In one embodiment, there is provided, a test system including a printed circuit board (PCB); a plurality of integrated circuits (ICs) mounted on the PCB, a first IC of the plurality including: a first test circuit having a first test access port (TAP) controller; and a second IC of the plurality including: a second test circuit having a second TAP controller; and an embedded tester having a test data output coupled to a test data input of the first TAP controller by way of a link circuit, the embedded tester configured to provide test control signals to the first TAP controller and the second TAP controller. The link circuit may be configured to allow transfer of an output signal from the test data output to the test data input of the first TAP controller when an external PCB tester is not connected to the PCB. The link circuit may include a resistor having a first terminal coupled at the test data output and a second terminal coupled at the test data input of the first TAP controller. The system may further include a bus coupled to the first IC and to the second IC, the bus formed at least in part on the PCB. The bus may include a signal line coupled to a first logic block and a first boundary scan logic of the first IC and coupled to a second logic block and a second boundary scan logic of the second IC. The first boundary scan logic may be coupled to the first TAP controller and the second boundary scan logic may be coupled to the second TAP controller. The first IC may be configured to transfer a first logic value to the second IC by way of the signal line during normal operation. The first logic value may be sampled by the first boundary scan logic or the second boundary scan logic in response to a sample command provided by way of the test control signals. The sampled first logic value may be transferred to the embedded tester by way of the corresponding first TAP controller or second TAP controller.

In another embodiment, there is provided, a test system including a printed circuit board (PCB); a first integrated circuit (IC) mounted on the PCB, the first IC including: a first test circuit configured for boundary scan testing; and a second IC mounted on the PCB, the second IC including: a second test circuit configured for boundary scan testing; and an embedded tester having a test data output coupled to a test data input of the first test circuit by way of a link circuit, the embedded tester configured to provide test commands by way of test control signals. The link circuit may be configured to allow transfer of an output signal from the test data output to the test data input of the first test circuit when an external PCB tester is not connected to the PCB. The link circuit may include a resistor having a first terminal coupled at the test data output and a second terminal coupled at the test data input. The system may further include an interconnect bus coupled to the first IC and to the second IC, the interconnect bus formed on the PCB. The interconnect bus may include a first signal line coupled to a first analog pin of the first IC and to a second analog pin of the second IC. The first signal line may be characterized as an analog test bus and wherein a voltage or current value may be routed from the first IC to the second IC by way of the analog test bus. The interconnect bus may further include a second signal line coupled to a first logic block and a first boundary scan logic of the first IC and coupled to a second logic block and a second boundary scan logic of the second IC. The first IC may be configured to transfer a first logic value to the second IC by way of the second signal line during normal operation.

In yet another embodiment, there is provided, a test system including a printed circuit board (PCB); a plurality of integrated circuits (ICs) mounted on the PCB, a first IC of the plurality including: a first test circuit having a first test access port (TAP) controller; and a second IC of the plurality including: a second test circuit having a second TAP controller; and an embedded tester having a test data output coupled to a test data input of the first TAP controller by way of a link circuit, the embedded tester configured to provide boundary scan test commands by way of test control signals to the first TAP controller and the second TAP controller. The link circuit may be configured to allow transfer of an output signal from the test data output to the test data input of the first TAP controller when an external PCB tester is not connected to the PCB. The embedded tester may be further configured to provide boundary scan test commands compliant with the IEEE 1149.1 standard.

By now it should be appreciated that there has been provided, a board level test system for in-application boundary scan testing. The system includes a plurality of integrated circuits (ICs) mounted on a printed circuit board (PCB) and configured in a daisy chain arrangement. One IC of the plurality includes an embedded tester which sends test commands to other ICs of the chain by driving test control signals when an external tester is not connected to the system. The embedded tester provides a test data stream to a next IC in the chain by way of a link circuit. When an external tester is connected to the system, outputs of the embedded tester are configured in a high impedance state so that the external tester can drive the test control signals unimpeded.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A test system comprising:
a printed circuit board (PCB);
a plurality of integrated circuits (ICs) mounted on the PCB, a first IC of the plurality comprising:
a first test circuit having a first test access port (TAP) controller; and
a second IC of the plurality comprising:
a second test circuit having a second TAP controller; and
an embedded tester having a test data output coupled to a test data input of the first TAP controller by way of a link circuit, the link circuit comprising a resistor having a first terminal coupled at the test data output and a second terminal coupled at the test data input of the first TAP controller, the embedded tester configured to provide test control signals to the first TAP controller and the second TAP controller.

2. The system of claim 1, wherein the link circuit is configured to allow transfer of an output signal from the test data output to the test data input of the first TAP controller when an external PCB tester is not connected to the PCB.

3. The system of claim 1, further comprising a bus coupled to the first IC and to the second IC, the bus formed at least in part on the PCB.

4. The system of claim 3, wherein the bus includes a signal line coupled to a first logic block and a first boundary scan logic of the first IC and coupled to a second logic block and a second boundary scan logic of the second IC.

5. The system of claim 4, wherein the first boundary scan logic is coupled to the first TAP controller and the second boundary scan logic is coupled to the second TAP controller.

6. The system of claim 4, wherein the first IC is configured to transfer a first logic value to the second IC by way of the signal line during normal operation.

7. The system of claim 6, wherein the first logic value is sampled by the first boundary scan logic or the second boundary scan logic in response to a sample command provided by way of the test control signals.

8. The system of claim 7, wherein the sampled first logic value is transferred to the embedded tester by way of the corresponding first TAP controller or second TAP controller.

9. A test system comprising:
a printed circuit board (PCB);
a first integrated circuit (IC) mounted on the PCB, the first IC comprising:
a first test circuit configured for boundary scan testing; and
a second IC mounted on the PCB, the second IC comprising:
a second test circuit configured for boundary scan testing; and
an embedded tester having a test data output coupled to a test data input of the first test circuit by way of a link circuit, the link circuit comprising a resistor having a first terminal coupled at the test data output and a second terminal coupled at the test data input, the embedded tester configured to provide test commands by way of test control signals.

10. The system of claim 9, wherein the link circuit is configured to allow transfer of an output signal from the test data output to the test data input of the first test circuit when an external PCB tester is not connected to the PCB.

11. The system of claim 9, further comprising an interconnect bus coupled to the first IC and to the second IC, the interconnect bus formed on the PCB.

12. The system of claim 11, wherein the interconnect bus comprises a first signal line coupled to a first analog pin of the first IC and to a second analog pin of the second IC.

13. The system of claim 12, wherein the first signal line is characterized as an analog test bus and wherein a voltage or current value is routed from the first IC to the second IC by way of the analog test bus.

14. The system of claim 12, wherein the interconnect bus further comprises a second signal line coupled to a first logic block and a first boundary scan logic of the first IC and coupled to a second logic block and a second boundary scan logic of the second IC.

15. The system of claim 14, wherein the first IC is configured to transfer a first logic value to the second IC by way of the second signal line during normal operation.

16. A test system comprising:
a printed circuit board (PCB);
a plurality of integrated circuits (ICs) mounted on the PCB, a first IC of the plurality comprising:
a first test circuit having a first test access port (TAP) controller; and
a second IC of the plurality comprising:
a second test circuit having a second TAP controller; and
an embedded tester having a test data output coupled to a test data input of the first TAP controller by way of a link circuit, the link circuit comprising a resistor having a first terminal coupled at the test data output and a second terminal coupled at the test data input, the embedded tester configured to provide boundary scan test commands by way of test control signals to the first TAP controller and the second TAP controller.

17. The system of claim 16, wherein the link circuit is configured to allow transfer of an output signal from the test data output to the test data input of the first TAP controller when an external PCB tester is not connected to the PCB.

18. The system of claim 16, wherein the embedded tester is further configured to provide boundary scan test commands compliant with the IEEE 1149.1 standard.

19. The system of claim 16, further comprising an interconnect bus coupled to the first IC and to the second IC, the interconnect bus formed on the PCB.

20. The system of claim 19, wherein the interconnect bus comprises a first signal line coupled to a first analog pin of the first IC and to a second analog pin of the second IC.

* * * * *